(12) United States Patent
Hogan et al.

(10) Patent No.: US 11,336,077 B2
(45) Date of Patent: May 17, 2022

(54) LOW COST OPTICAL PACKAGE

(71) Applicant: Vixar Inc., Plymouth, MN (US)

(72) Inventors: William Hogan, Minneapolis, MN (US); Mary Brenner, Plymouth, MN (US)

(73) Assignee: Vixar, Inc., Plymouth, MN (US)

(*) Notice: Subject to any disclaimer, the term of this patent is extended or adjusted under 35 U.S.C. 154(b) by 0 days.

(21) Appl. No.: 15/979,694

(22) Filed: May 15, 2018

(65) Prior Publication Data

US 2018/0269649 A1 Sep. 20, 2018

Related U.S. Application Data

(63) Continuation of application No. 14/741,081, filed on Jun. 16, 2015, now Pat. No. 9,991,673, which is a
(Continued)

(51) Int. Cl.
*H01S 5/183* (2006.01)
*H01S 5/42* (2006.01)
(Continued)

(52) U.S. Cl.
CPC .............. *H01S 5/183* (2013.01); *H01S 5/023* (2021.01); *H01S 5/0225* (2021.01);
(Continued)

(58) Field of Classification Search
CPC ...... H01S 5/183; H01S 5/005; H01S 5/02236; H01S 5/0228; H01S 5/423; H01S 5/0042;
(Continued)

(56) References Cited

U.S. PATENT DOCUMENTS

| | | | | |
|---|---|---|---|---|
| 3,766,616 A | * | 10/1973 | Staudte | G04D 3/0035 |
| | | | | 219/121.85 |
| 4,581,680 A | * | 4/1986 | Garner | H05K 3/3436 |
| | | | | 361/768 |

(Continued)

OTHER PUBLICATIONS

Diffuser definition (Merriam-Webster), p. 1. (Year: 2019).*

*Primary Examiner* — Xinning(Tom) Niu
*Assistant Examiner* — Delma R Fordé
(74) *Attorney, Agent, or Firm* — Winthrop & Weinstine, P.A.; Alicia Griffin Mills; Nadeem W. Schwen

(57) ABSTRACT

An optical package having a patterned submount, an optoelectronic device mounted to the patterned submount, a spacer affixed on one side to the patterned submount, the spacer having a bore hole therethrough wherein the optoelectronic device is positioned, and an optical element affixed to the spacer on a side opposite the patterned submount and covering the spacer bore hole. The patterned submount may be a circuit board. The optoelectronic device may be a VCSEL. The spacer may be affixed to the circuit board, for example, using an epoxy preform or an adhesive laminate. The spacer may, for example, be manufactured from a sheet of stainless steel or from a circuit board. The optical element may be, for example, a diffuser, a concave lens, a convex lens, a holographic element, polarizers, or diffraction gratings. The optical element may be affixed to the spacer using an epoxy preform or an adhesive laminate.

20 Claims, 12 Drawing Sheets

Related U.S. Application Data continuation of application No. 14/103,127, filed on Dec. 11, 2013, now abandoned.

(60) Provisional application No. 61/735,724, filed on Dec. 11, 2012.

(51) Int. Cl.

| | | |
|---|---|---|
| *H01S 5/0225* | (2021.01) | |
| *H01S 5/023* | (2021.01) | |
| *H01S 5/0233* | (2021.01) | |
| *H01S 5/0235* | (2021.01) | |
| *H01S 5/02253* | (2021.01) | |
| *H01S 5/02325* | (2021.01) | |
| *H01L 33/48* | (2010.01) | |
| *H01S 5/00* | (2006.01) | |
| *H01S 5/02208* | (2021.01) | |
| *H01S 5/0237* | (2021.01) | |
| *H01S 5/02257* | (2021.01) | |
| *H01S 5/02326* | (2021.01) | |

(52) U.S. Cl.
CPC .......... *H01S 5/0233* (2021.01); *H01S 5/0235* (2021.01); *H01S 5/02253* (2021.01); *H01S 5/02325* (2021.01); *H01L 33/483* (2013.01); *H01L 2224/48091* (2013.01); *H01S 5/0042* (2013.01); *H01S 5/0237* (2021.01); *H01S 5/02208* (2013.01); *H01S 5/02257* (2021.01); *H01S 5/02326* (2021.01); *H01S 5/423* (2013.01); *Y10T 156/10* (2015.01); *Y10T 156/1052* (2015.01)

(58) Field of Classification Search
CPC ............ H01S 5/02208; H01S 5/02252; H01S 5/02272; H01S 5/02296; H01S 5/022; H01S 5/00; H01S 5/002296; H01S 5/02248; H01S 5/02256; H01S 5/42–426; H01S 5/02288; H01S 5/0226; H01S 5/18–183; H01S 5/02218; H01L 2224/48091; H01L 2224/00014; H01L 23/02; H01L 23/06; H01L 23/12; H01L 33/58; H01L 33/60; H01L 33/483; H01L 33/486; Y10T 156/1052; Y10T 156/10
See application file for complete search history.

(56) References Cited

U.S. PATENT DOCUMENTS

| | | | |
|---|---|---|---|
| 5,835,518 A * | 11/1998 | Mundinger | H01S 5/4031 372/50.12 |
| 5,838,703 A | 11/1998 | Lebby et al. | |
| 6,795,461 B1 | 9/2004 | Blair et al. | |
| 7,106,771 B2 | 9/2006 | Shinohara et al. | |
| 7,177,331 B2 | 2/2007 | Yen et al. | |
| 7,309,174 B2 * | 12/2007 | Farr | G02B 6/4206 385/53 |
| RE41,738 E | 9/2010 | Brenner et al. | |
| 8,249,121 B2 | 8/2012 | Brenner | |
| 8,494,018 B2 | 7/2013 | Brenner et al. | |
| 8,660,161 B2 | 2/2014 | Brenner et al. | |
| 8,697,459 B2 * | 4/2014 | Adachi | H01S 5/423 438/28 |
| 8,749,796 B2 | 6/2014 | Pesach et al. | |
| 2006/0227545 A1 * | 10/2006 | Mok | G02F 1/133603 362/227 |
| 2007/0001177 A1 | 1/2007 | Bruning et al. | |
| 2009/0010297 A1 | 1/2009 | Uchida | |
| 2009/0087931 A1 | 4/2009 | Lee et al. | |
| 2009/0135864 A1 | 5/2009 | Aruga | |
| 2009/0137073 A1 | 5/2009 | Park et al. | |
| 2010/0295079 A1 | 11/2010 | Melman | |
| 2012/0051382 A1 * | 3/2012 | Miao | H01S 5/02446 372/50.1 |
| 2012/0177074 A1 * | 7/2012 | Liu | H01S 5/023 372/36 |
| 2013/0016509 A1 * | 1/2013 | Van de Ven | F21V 7/00 362/235 |
| 2013/0019461 A1 * | 1/2013 | Rudmann | G01J 5/0235 29/592.1 |
| 2013/0022069 A1 | 1/2013 | Lee et al. | |
| 2013/0034117 A1 | 2/2013 | Hibbs-Brenner et al. | |
| 2013/0037831 A1 * | 2/2013 | Rudmann | H01L 25/167 257/88 |
| 2013/0256711 A1 * | 10/2013 | Joo | H01L 33/505 257/88 |
| 2013/0308672 A1 | 11/2013 | Pan et al. | |
| 2014/0021582 A1 | 1/2014 | Kovats | |
| 2014/0064315 A1 | 3/2014 | Dummer et al. | |
| 2017/0309605 A1 * | 10/2017 | Rudmann | H01L 27/14634 |
| 2017/0345866 A1 * | 11/2017 | Joo | H01L 24/97 |

* cited by examiner

LOW COST OPTICAL PACKAGE

CROSS-REFERENCE TO RELATED APPLICATIONS

The present application is a continuation of U.S. patent application Ser. No. 14/741,081, titled "Low Cost Optical Package," filed Jun. 16, 2015, which is a continuation of U.S. patent application Ser. No. 14/103,127, titled "Low Cost Optical Package," filed Dec. 11, 2013, which claims priority to U.S. Prov. Pat. Appl. No. 61/735,724, titled "Low Cost Optical Package," filed Dec. 11, 2012, each of which is incorporated by reference herein in its entirety.

FIELD OF THE INVENTION

The present disclosure relates to optical packages. Particularly, the present disclosure relates to low cost optical packages for optoelectronic dies, such as Vertical-Cavity Surface-Emitting Lasers (VCSELs), light emitting diodes (LEDs), or photodetectors.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

VCSELs have been offered commercially since the mid-1990s. One of the largest applications for VCSELs has been in fiber optic communication, and they were initially offered in transistor outline (TO) packages, hermetically sealed. However, efforts have been made to make VCSELs more robust in environments that vary in temperature and/or humidity so that a wider variety of packages can be used. In broadening the application of VCSELs to consumer applications, there is a need in the art for packaging approaches that are both low cost and which also enable the easy integration of various electrical and optical elements with the VCSEL.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The present disclosure, in one embodiment, relates to an optical package having a patterned submount, an optoelectronic device mounted to the patterned submount, a spacer affixed on one side to the patterned submount, the spacer having a bore hole therethrough wherein the optoelectronic device is positioned, and an optical element affixed to the spacer on a side opposite the patterned submount and covering the spacer bore hole. In one embodiment, the patterned submount may be a circuit board, such as a printed circuit board. The optoelectronic device may be a VCSEL. The spacer may be affixed to the circuit board, for example, using an epoxy preform or an adhesive laminate. The spacer, in one embodiment, may be manufactured from a sheet of stainless steel. In another embodiment, the spacer may be manufactured from a circuit board. The optical element may be, for example, a diffuser, a concave lens, a convex lens, a holographic element, polarizers, or diffraction gratings. The optical element, such as a diffuser, may be affixed to the spacer using an epoxy preform or an adhesive laminate.

The present disclosure, in another embodiment, relates to an array of optical packages having a first circuit board panel comprising a plurality of VCSEL submounts each configured for mounting a VCSEL thereto, a second circuit board panel including a plurality of bore holes therethrough, the second circuit board panel being shaped and dimensioned to align with the first circuit board panel such that the plurality of bore holes align with the plurality of VCSEL submounts, and an optical panel including a sheet of optic-altering material, the optical panel being shaped and dimensioned to align with the second circuit board panel such that the sheet covers the plurality of bore holes. In one embodiment, the first circuit board panel may be a printed circuit board. The second circuit board panel may be affixed, on a first side thereof, to the first circuit board panel, and may be affixed, on a second side thereof, to the optical panel. In one embodiment, the second circuit board panel may be coated on the first and second sides thereof with an adhesive laminate for affixing the second circuit board panel to the first circuit board panel and the optical panel by lamination. A VCSEL may be mounted to each of the plurality of VCSEL submounts. In one embodiment, the optical panel comprises a sheet of light diffusing material.

The present disclosure, in still another embodiment, relates to a method of making an optical package. The method may involve attaching a plurality of VCSELs to a first circuit board panel comprising a plurality of VCSEL submounts, each configured for receiving a VCSEL. A second circuit board panel may be aligned with the first circuit board panel, the second circuit board panel having a plurality of bore holes therethrough and being aligned with the first circuit board panel such that the plurality of bore holes align with the plurality of mounted VCSELs. An optical panel may be aligned with the second circuit board panel, the optical panel having a sheet of optic-altering material and being aligned with the second circuit board panel such that the sheet covers the plurality of bore holes. The method may also involve laminating the first circuit board panel, second circuit board panel, and optical panel together. The method may further include dicing the laminated panels into singular optical packages, each optical package comprising a VCSEL aligned with a bore hole and configured to emit a laser beam through the optic-altering material of the optical panel.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

DETAILED DESCRIPTION

The present disclosure relates to novel and advantageous optical packages. Particularly, the present disclosure relates to novel and advantageous low cost optical packages for VCSELs. However, while the below description focuses mainly on packaging VCSELs, the apparatus and methods described herein could also be applied to the packaging of other optical components, such as but not limited to, LEDs and photodetectors. While any VCSELs or other optical components may be utilized, examples of the type of VCSELs that may be utilized with the optical packages described herein include those described in: U.S. Pat. No. RE41,738, titled "Red Light Laser"; U.S. Pat. No. 8,249,121, titled "Push-Pull Modulated Coupled Vertical-Cavity Surface-Emitting Lasers and Method"; U.S. Pat. No. 8,494,018, titled "Direct Modulated Modified Vertical-Cavity Surface-Emitting Lasers and Method"; U.S. patent application Ser. No. 13/559,821, titled "Method and Apparatus Including Improved Vertical-Cavity Surface-Emitting Lasers," filed Jul. 27, 2012; U.S. patent application Ser. No. 13/571,839, titled "Push-Pull Modulated Coupled Vertical-Cavity Surface-Emitting Lasers and Method," filed Aug. 10, 2012; U.S. patent application Ser. No. 13/729,166, titled "Method and Apparatus Including Movable-Mirror MEMS-Tuned Surface-Emitting Lasers," filed Dec. 28, 2012, each of which is hereby incorporated by reference herein in its entirety.

More particularly, the present disclosure describes a packaging approach that provides a great deal of flexibility in integrating VCSELs in arrays with other types of electrical components or elements, such as but not limited to, integrated circuits (ICs) and passive components, like resistors and capacitors, as well as with a variety of optical components or elements, including but not limited to, lenses, diffusers, and holographic elements. Optical elements, for example, may be aligned with respect to a VCSEL component in the x-, y-, and z-directions. The z-direction (i.e., the direction perpendicular to the VCSEL chip) can be a particular challenge as the distance between the VCSEL and the optical element should be well-controlled.

Figure 1A:
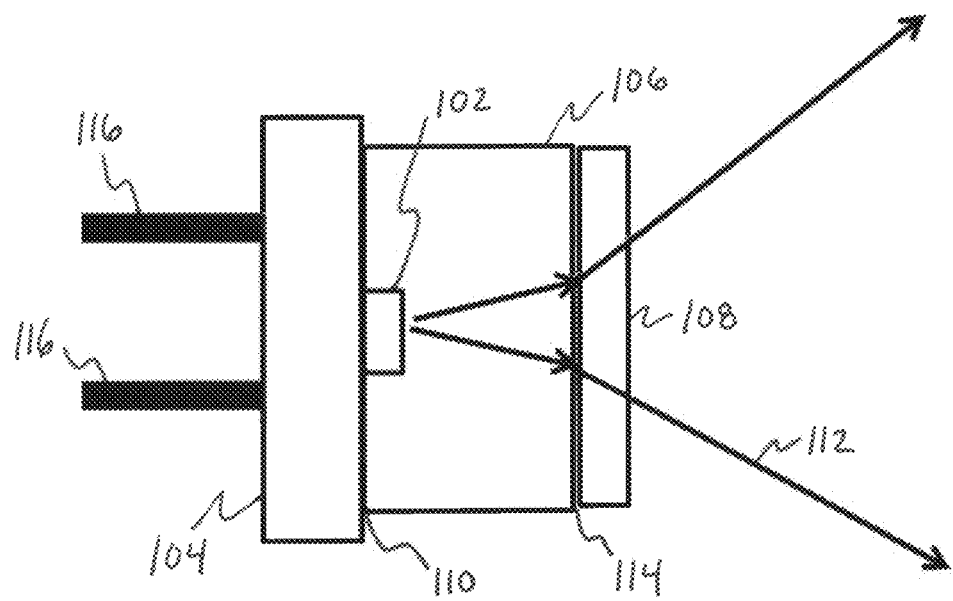
FIG. 1A is a schematic side view of an optical package according to an embodiment of the present disclosure.
Figure 1B:
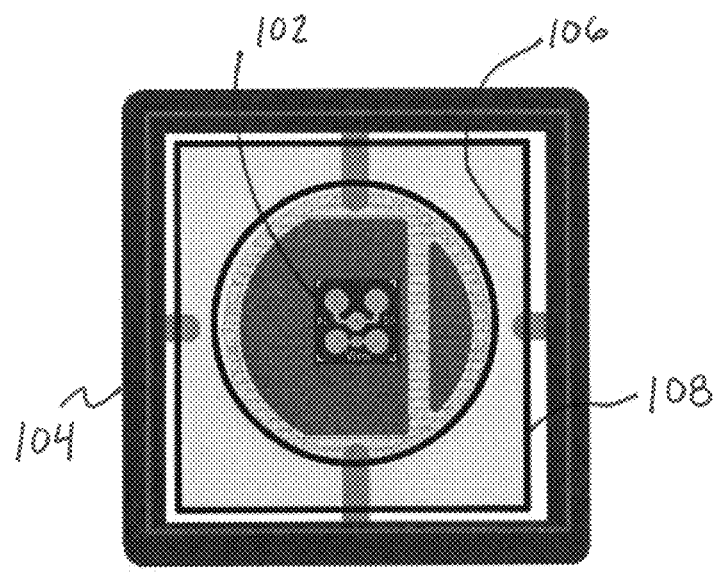
FIG. 1B is a schematic top view of an optical package according to an embodiment of the present disclosure.
Figure 2A:
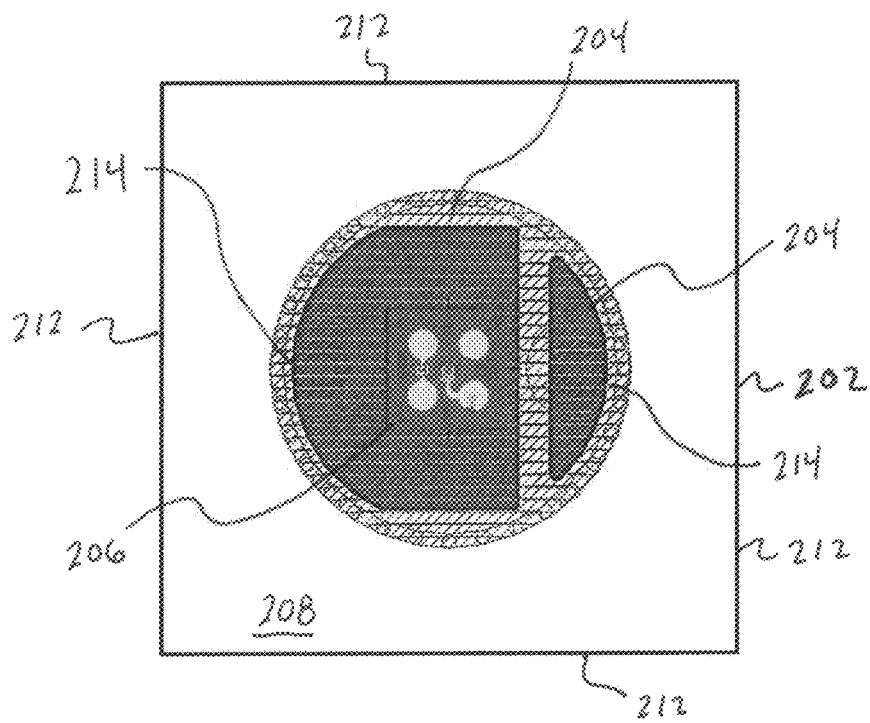
FIG. 2A is a schematic top view of a circuit board for an optical package with mounted VCSEL according to an embodiment of the present disclosure.
Figure 2B:
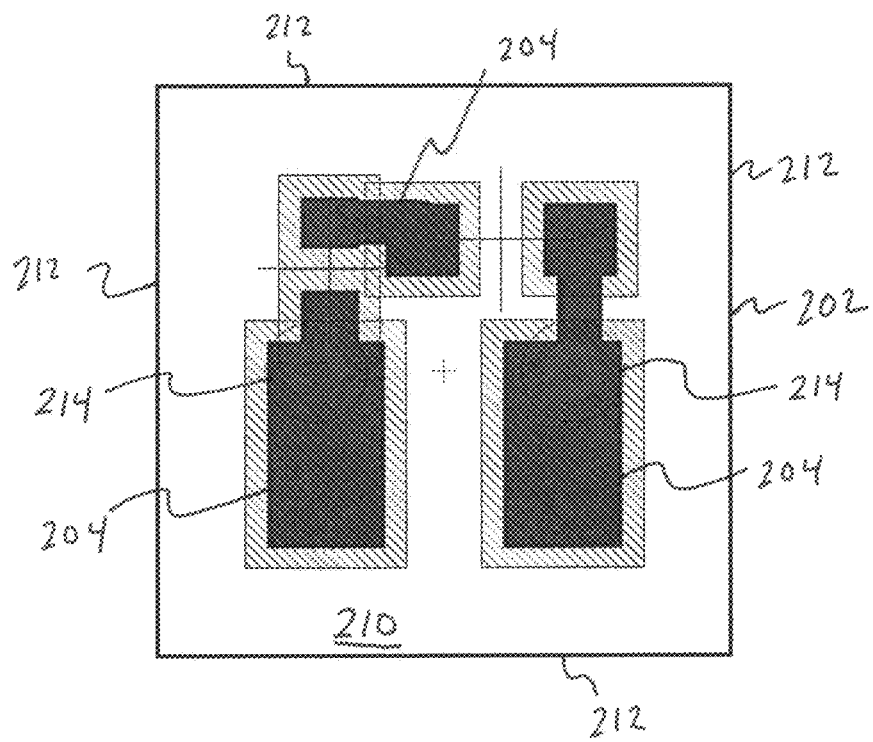
FIG. 2B is a schematic bottom view of a circuit board for an optical package according to an embodiment of the present disclosure.
Figure 3A:
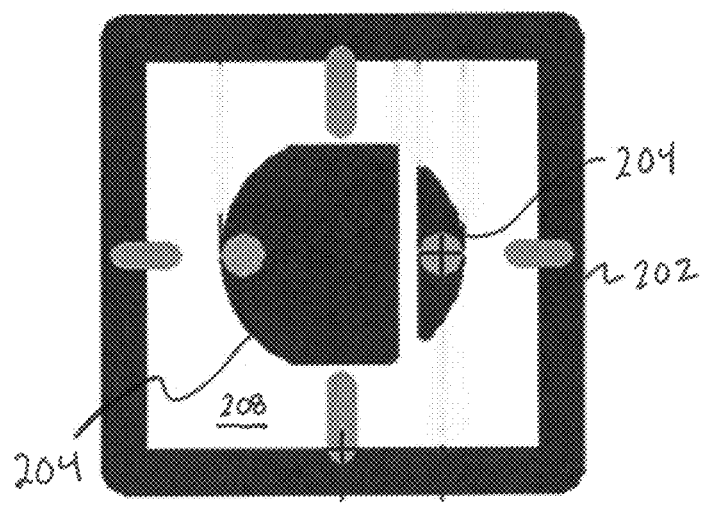
FIG. 3A is a schematic top view of a circuit board illustrating solder/bond pad patterns according to an embodiment of the present disclosure.
Figure 3B:
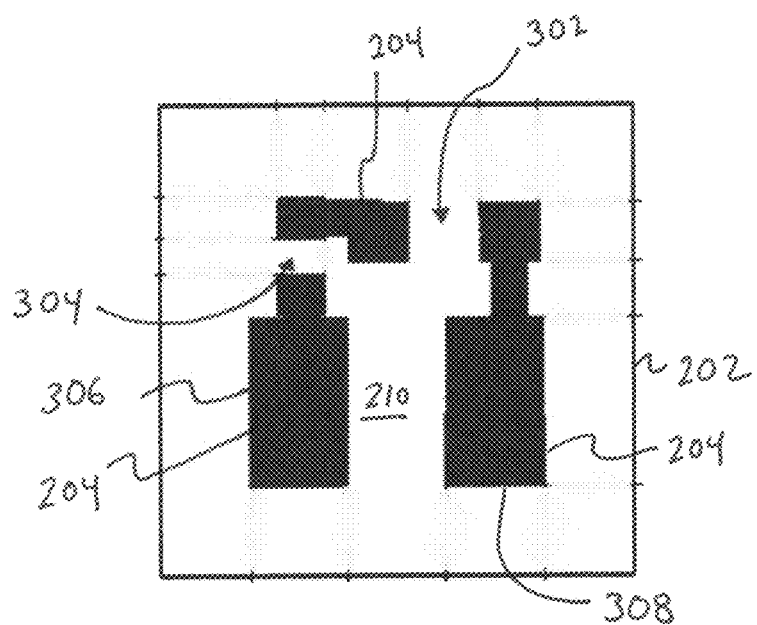
FIG. 3B is a schematic bottom view of a circuit board illustrating solder/bond pad patterns according to an embodiment of the present disclosure.

In general, an optical package according to the present disclosure, illustrated conceptually in FIGS. 1A and 1B, may generally involve mounting a VCSEL die or chip 102 (also referred to herein simply as VCSEL) or multiple VCSELs on a circuit board or patterned submount 104, such as a ceramic submount, creating a spacer layer 106, and mounting an optical element 108 on top of the spacer layer. The circuit board or submount 104 can also be designed to incorporate many other components, including but not limited to, one or more ICs for driving the VCSEL(s), resistors, capacitors, amplifiers (e.g., if connected to a photodetector), and/or electrical connectors. The circuit board or submount 104 can be designed or laid out to accept multiple VCSEL, LED, or photodetector die to create an array. Any suitably variety of board materials may be utilized. In one particular embodiment, a circuit board with a copper core may be used to provide improved thermal conductivity. While illustrated conceptually as a square or rectangular board, as will be illustrated later, the packages described herein may be configured in any suitable shape, such as circular, hexagonal or other polygonal shape, etc., and is not limited to being shaped as a square or rectangle.

In one embodiment, the VCSEL die 102 may be placed in direct contact with the copper core, for example, by exposing the core and placing the VCSEL directly on top of the core or by creating copper filled vias that would lie under the VCSEL that connect to the core. The VCSEL 102 may be attached to the board 104 using any suitable means of attachment, such as a conductive epoxy, or for better thermal conductivity, by using a solder. If a VCSEL has been built on a conducting substrate, then placing it in contact with metal on or in the board 104 can provide the electrical contact to one side of the VCSEL's p-n junction. Contact to the other side of the VCSEL's p-n junction may be provided to the VCSEL, for example, by wire bonding to bond pads on a top surface of the VCSEL chip 102. Alternatively, both contacts to the VCSEL 102 may be accessed on a top surface of the VCSEL and can be wire bonded to the board 104. In such embodiments, the substrate side contact of the VCSEL may generally continue to serve as a thermal heat sink.

According to the present embodiment, in order to provide proper spacing from the VCSEL 102 to any optical element 108, a spacer 106 or spacer layer can be created which can be operably coupled or otherwise attached to the circuit board or submount 104. The spacer 106 may be made from any suitable material, such as but not limited to, metal, ceramic, or a plastic material. The spacer 106 may be manufactured using any manufacturing process or technique, and in some embodiments for example, the spacer may be molded or machined. The spacer 106 may be suitably coupled, attached, or affixed to the circuit board or submount 102 using any suitable means for attachment, such as but not limited to, using a solder or an epoxy 110. An epoxy could be dispensed, or could be an epoxy preform. An epoxy preform may provide a more controlled thickness for accurate control of the height of the spacer. The solder or epoxy 110 thickness, plus the spacer 106 thickness may be designed to position or hold an optical element 108 at a predetermined height above an emitting aperture of the VCSEL 102. This height, for example, could range from about 0.1 mm to several millimeters above the emitting aperture of the VCSEL 102. The desired height may vary from application to application. In one embodiment, the desired height may be determined by the beam divergence of the VCSEL 102 and the design of any optical element 108 that is placed above the VCSEL. Many optical elements require a spacing that is larger than that which is typically available from conventional ceramic packages.

A variety of optical elements 108 may be utilized with or in the optical packages of the present disclosure. In one embodiment, for example, the optical element 108 positioned on top of the spacer 106 may be a convex or concave lens, a diffuser, which spreads out the VCSEL beam 112, or a holographic element that could split or shape the VCSEL beam. The optical element 108 could also include elements, such as but not limited to, polarizers or gratings that can bend the VCSEL beam or select a particular wavelength.

Some of these optical elements could require alignment in the x- and y-directions relative to an optoelectronic die, such as a VCSEL, LED, or photodetector. In one embodiment, this can be achieved by incorporating alignment marks into the circuit board or submount 104 and the optical element 108. A standard vision system conventionally used in board manufacturing, for example, may be used to perform the alignment.

The optical element 108 may be attached to the spacer 106 using any suitable means of attachment, such as but not limited to, using a solder or an epoxy 114. An epoxy could be dispensed, or could be an epoxy preform. Again, an epoxy preform may provide a more controlled thickness for accurate control of the height of the spacer. The optical element 108 may be made of any suitable material and manufactured using any suitable manufacturing process or technique. In one particular embodiment, the optical element 108 may be made of glass or plastic and could be molded, machined, polished, and/or etched.

The assembly of the above described components may be performed using any standard board manufacturing processes, such as pick and place of the components using automated systems with machine vision systems. A panel of smaller circuit board-based packages can be assembled simultaneously for additional efficiencies. In general, a panel of circuit boards may be populated with the optoelectronic die (e.g., VCSEL, LED, photodetector), other ICs, passive electrical components, like resistors and LEDs, the spacer, and any optical element. Since the spacer and optical element can be attached after the placement and wire bonding of other components, wire bonding issues created by the presence of a deep wall on a package may be avoided. A burn-in of the optical element(s) 108 while still attached to the board 104, may be implemented. Even testing could be performed in such panel form, all before singulating the panel into individual circuit board packages. This can simplify handling of components during manufacturing, thereby further reducing cost.

FIGS. 2A-6B illustrate an implementation of one particular package embodiment according to the present disclosure. In this example embodiment, the circuit board 202, illustrated in FIGS. 2A-3B, may be patterned with solder pads 204 configured or patterned to incorporate a VCSEL 206 on one side 208 (e.g., a top side), and a resistor (e.g., at position 302) and a capacitor (e.g., at position 304), as well as the attachment of wire leads 116 (see FIG. 1A) (e.g., at position 306, 308) on the other side 210 (e.g., a bottom side). However, other configurations, including more or fewer components in different configurations, are possible and suitable. Resistor and capacitor values may vary depending on the VCSEL used and application desired. In the embodiment illustrated, the resistor and capacitor, positioned where shown, may form a series RC filter in parallel with the VCSEL.

In the illustrated embodiment, the board-based package includes a printed circuit board (PCB) 202 that is approximately 2 mm in length on at least one edge 212, and in a particular embodiment is approximately 2 mm on each edge, and is about 20 mil thick. However, other sizes, shapes, and dimensions than those illustrated are suitable and encompassed by the present disclosure. The PCB 202, in one embodiment, may be a ceramic-filled epoxy board, such as the material identified as RO4350B provided by Rogers Corporation, and may include a wire bondable gold finish. As indicated above, the PCB 202 may include vias 214, such as copper-filled vias, created through the PCB to connect the VCSEL 206 to the PCB core and wire leads. In one embodiment, the vias 214 may be approximately 4 mil in diameter; however, other dimensions are possible and suitable.

The VCSEL 206 may be mounted or attached to side 208 of the board 202 using any suitable means of attachment, such as a conductive epoxy or using a solder. In one embodiment, the VCSEL 206 may be mounted or attached to a solder pad 204 on side 208 using a conductive silver epoxy and may be wire bonded to the opposite solder pad on side 208 to complete the circuit. The resistor, capacitor, and wire leads, as well as any other surface mount devices may be soldered to side 210 of the board 202.

Figure 4A:
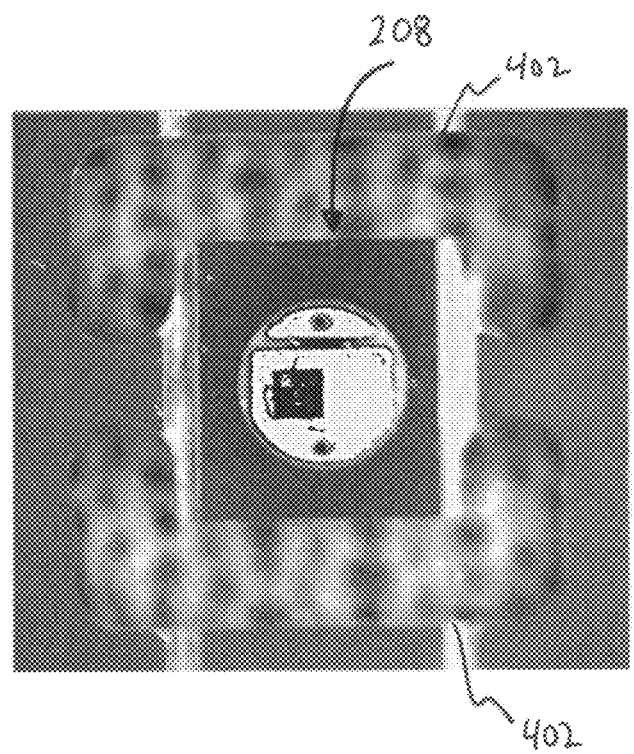
FIG. 4A is a top view of a circuit board for an optical package with mounted VCSEL according to an embodiment of the present disclosure.
Figure 4B:
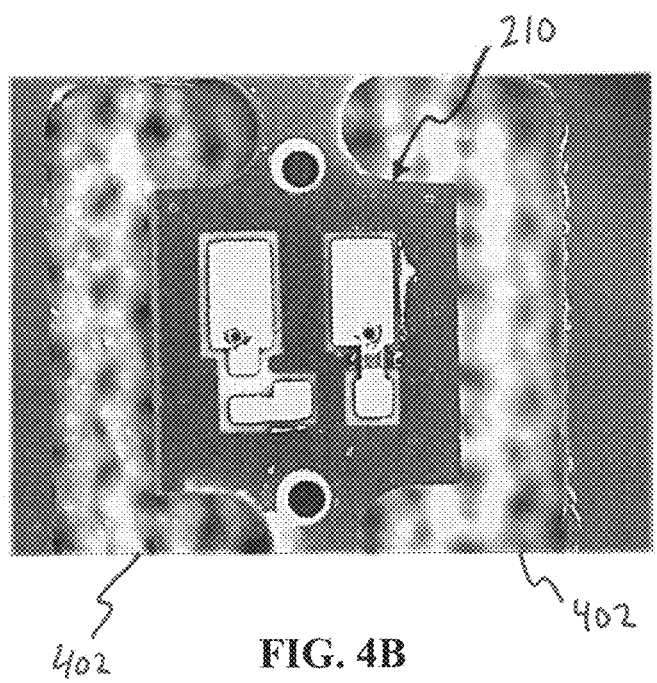
FIG. 4B is a bottom view of a circuit board for an optical package according to an embodiment of the present disclosure.

A panel of several circuit board-based packages can be assembled simultaneously for additional efficiencies. In one embodiment, for example, the panel may comprise a 4×4 array of packages, and may include score lines, such as V-score lines, for easier singulation of the packages. FIGS. 4A and 4B illustrate magnified samples of sides 208 and 210 of a package manufactured in an array. In one embodiment, as illustrated in FIGS. 4A and 4B, the panel may include routing 402 around some edges of the individual packages so that they can be broken out of, or otherwise removed from, the panel relatively easily.

Figure 5C:
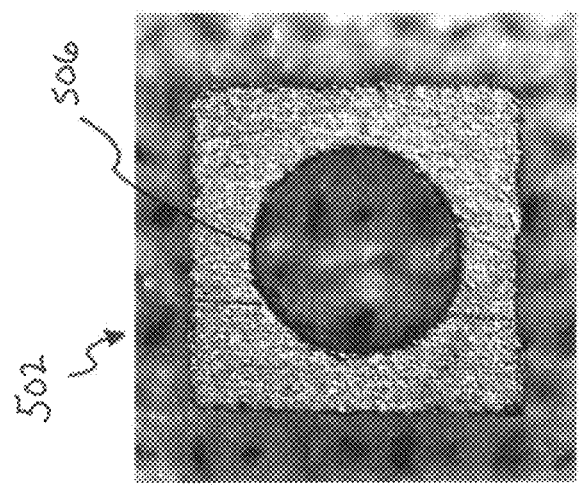
FIG. 5C is a top view of a spacer for an optical package according to an embodiment of the present disclosure.
Figure 5B:
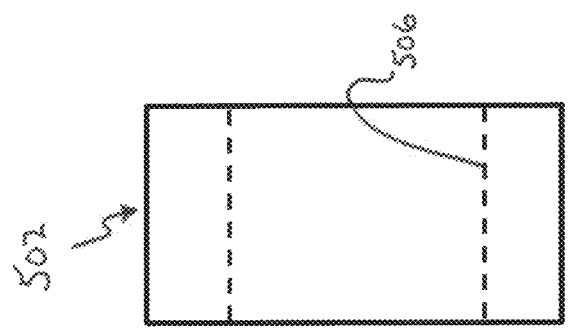
FIG. 5B is a schematic side view of a spacer for an optical package according to an embodiment of the present disclosure.
Figure 5A:
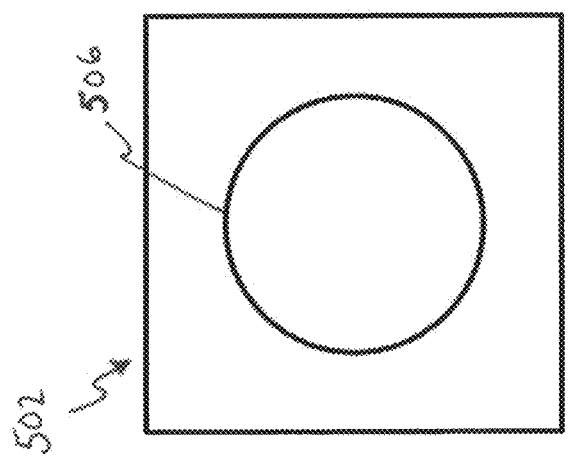
FIG. 5A is a schematic top view of a spacer for an optical package according to an embodiment of the present disclosure.

A spacer 502, illustrated in FIGS. 5A-5C may be operably coupled or otherwise attached to the PCB 202. While the spacer 502 may be made from any suitable material, in one embodiment, the spacer may be made from a thin sheet of stainless steel, with a specified thickness as required or desired for the application. The stainless steel sheet may be cut generally into a rectangle, and a water jet system or the like may be used to generally form a circular bore hole 506 in the middle therethrough. As indicated above, the spacer 502 may be suitably coupled, attached, or affixed to the circuit board 202 using any suitable means for attachment, such as but not limited to, using a solder or an epoxy. In the embodiment illustrated, the spacer 502 may be approximately 1.9 mm square around the outside edges and include a central bore hole 506 having a diameter of about 1.2 mm. In one embodiment, the thickness of the spacer 502 may be about 0.9 mm. However, other sizes and dimensions for the spacer 502 and central bore hole 506 may be utilized.

Figure 6A:
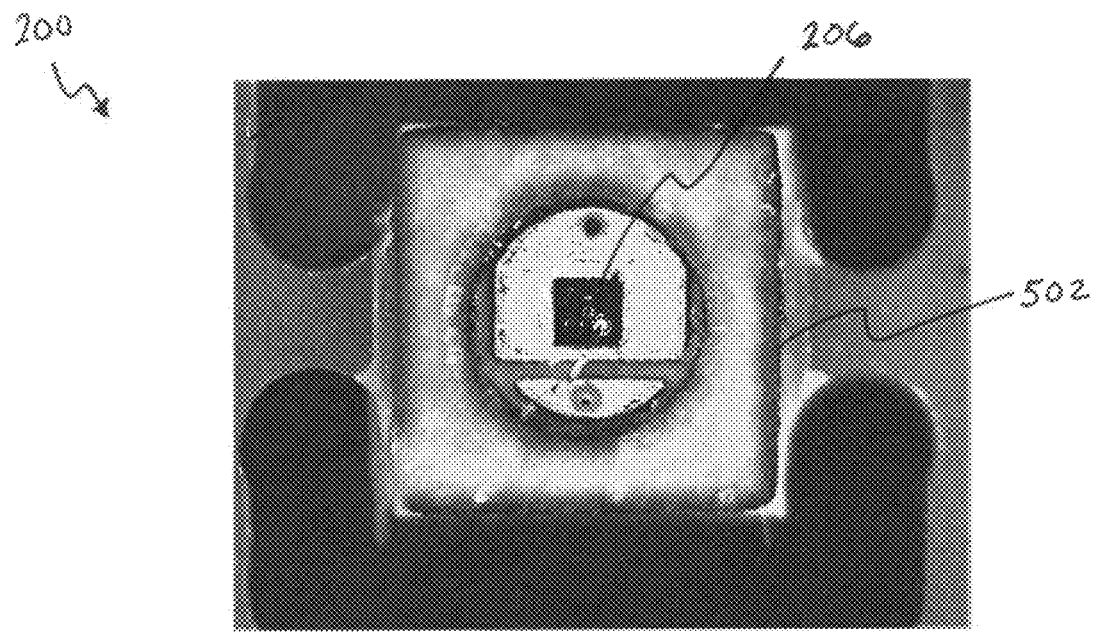
FIG. 6A is a top view of an optical package, without an optical element layer, according to an embodiment of the present disclosure.
Figure 6B:
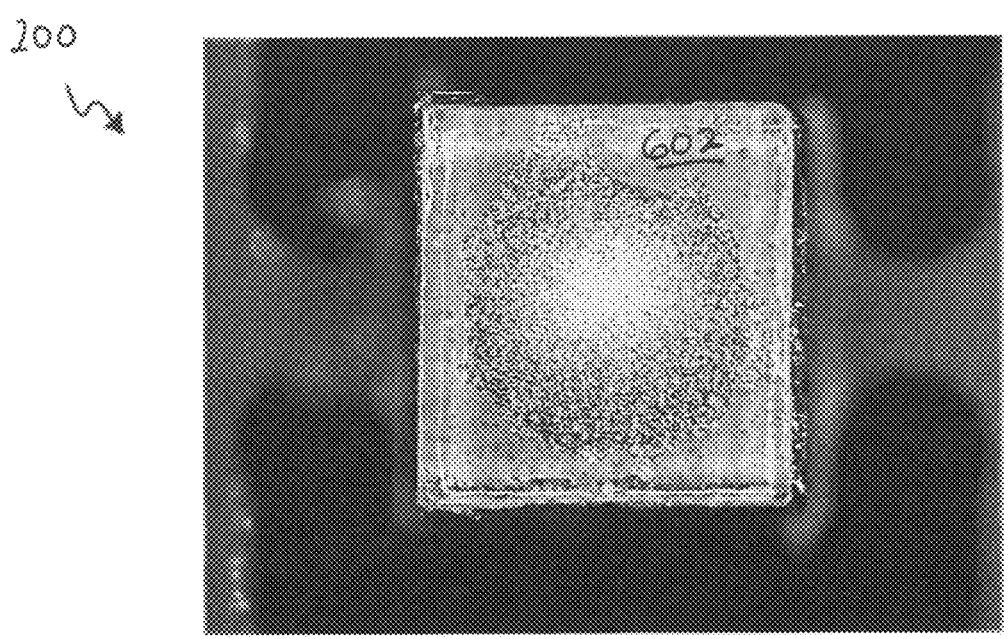
FIG. 6B is a top view of an optical package, with a diffuser layer, according to an embodiment of the present disclosure.

FIG. 6A illustrates a magnified sample of an optical package 200 with the spacer 502 attached thereto, but without any optical element. FIG. 6B illustrates a magnified sample of optical package 200 including an optical component 602. In one embodiment, the optical component 602 may be a diffuser, such as a thin film, plastic diffuser. A sheet of the diffuser material may be trimmed into rectangles, or other corresponding shape, slightly smaller than the outer dimensions of the spacer 502, and mounted, diffuser surface toward the VCSEL 206, to the spacer as described above. In some embodiments, x- and y-alignment of the diffuser relative the VCSEL 206 may not be required. However, it may be desirable to maintain at least a 0.5 mm spacing between the VCSEL 206 and the diffuser 602. In one particular embodiment, the diffuser material may be a 10 mil, polycarbonate diffuser available from Luminit LLC.

The board 202 may be laid out and built by standard board manufacturing processes. The resistor and capacitor may attached to the bottom side 210 of the board 202, and then the VCSEL 206 may be attached and wire bonded to the top side 208 of the board. The diffuser 602 may be attached using an epoxy to the stainless steel spacer 502, and then the spacer 502 may be attached using epoxy to the board 202. The epoxy used may be a biocompatible epoxy, and may be a continuous ring, having no gaps, for preventing leaks. Using a water resistant epoxy may help create a very compact and water tight package for, for example, medical applications. With reference back to FIG. 1A, lead or connection wires 116 may be soldered to the bottom side 210 of the board 202 to the solder pads. While any suitable connection wires may be utilized, in one embodiment, the connection wires 116 may be 38 American wire gauge (AWG), stranded copper wires. The connection wires 116 may be pre-tinned and pre-bent before attachment to the PCB 202 in array form. In some embodiments, the connection wires 116 may then be configured to exit the array panel in a direction along the optical axis (i.e., normal to the PCB 202). While one order of steps for manufacturing optical package 200, it is recognized that some steps may be eliminated, others added, and/or some steps may be carried out in a different order, all within the scope of the present disclosure.

Figure 7A:
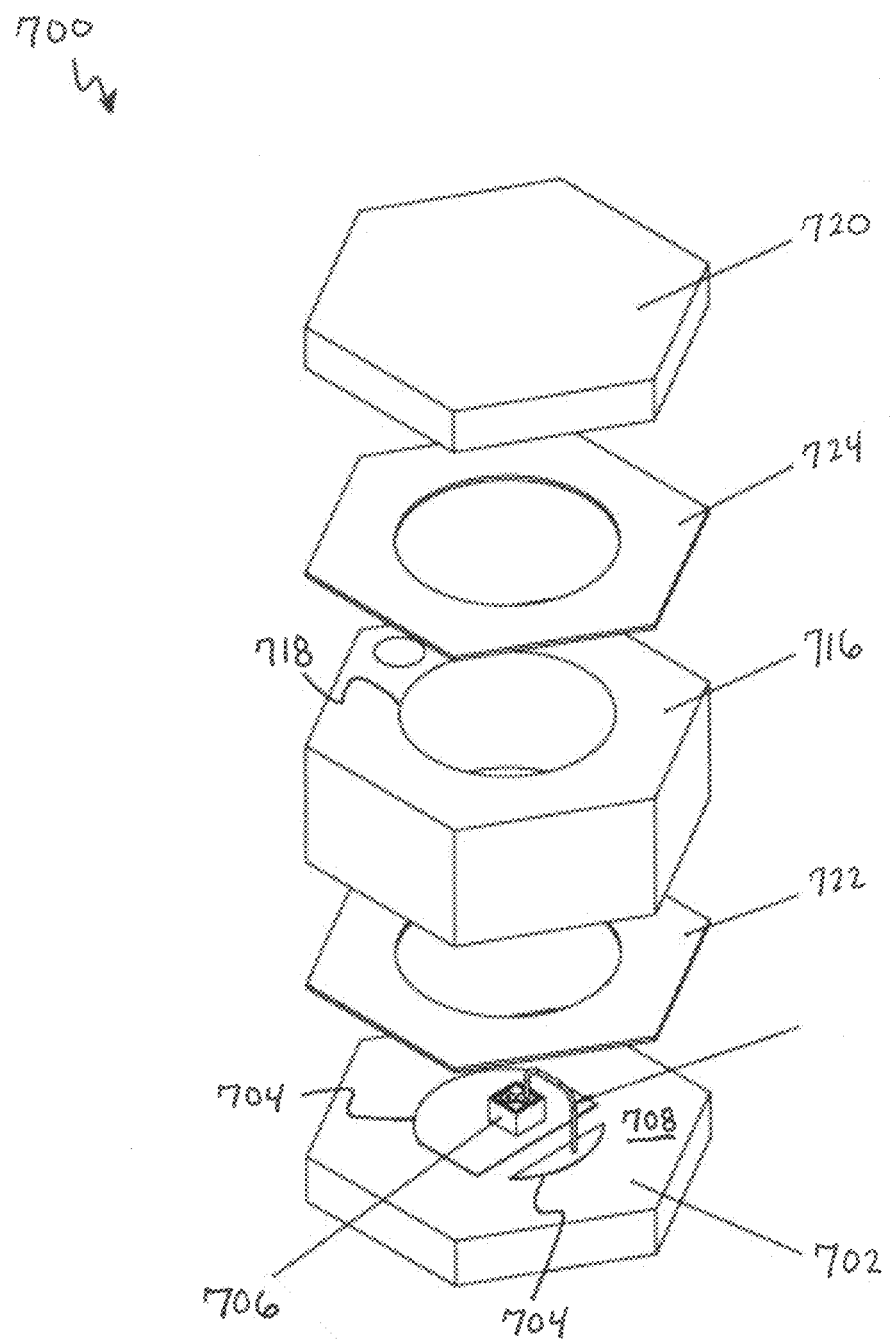
FIG. 7A is a schematic exploded view of an optical package according to an embodiment of the present disclosure.
Figure 7B:
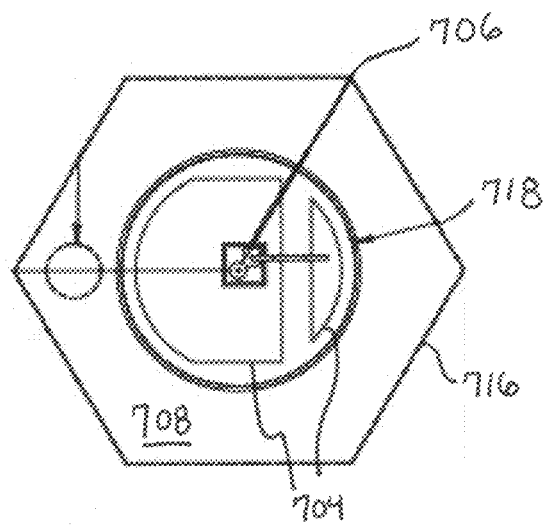
FIG. 7B is a schematic top view of an optical package according to an embodiment of the present disclosure.
Figure 7C:
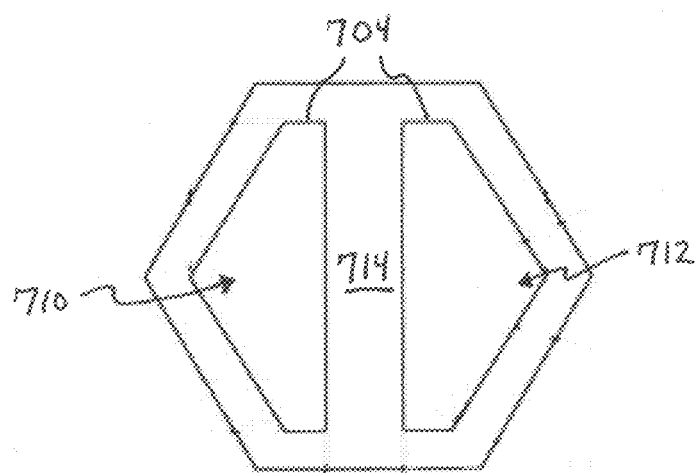
FIG. 7C is a schematic bottom view of an optical package according to an embodiment of the present disclosure.
Figure 8:
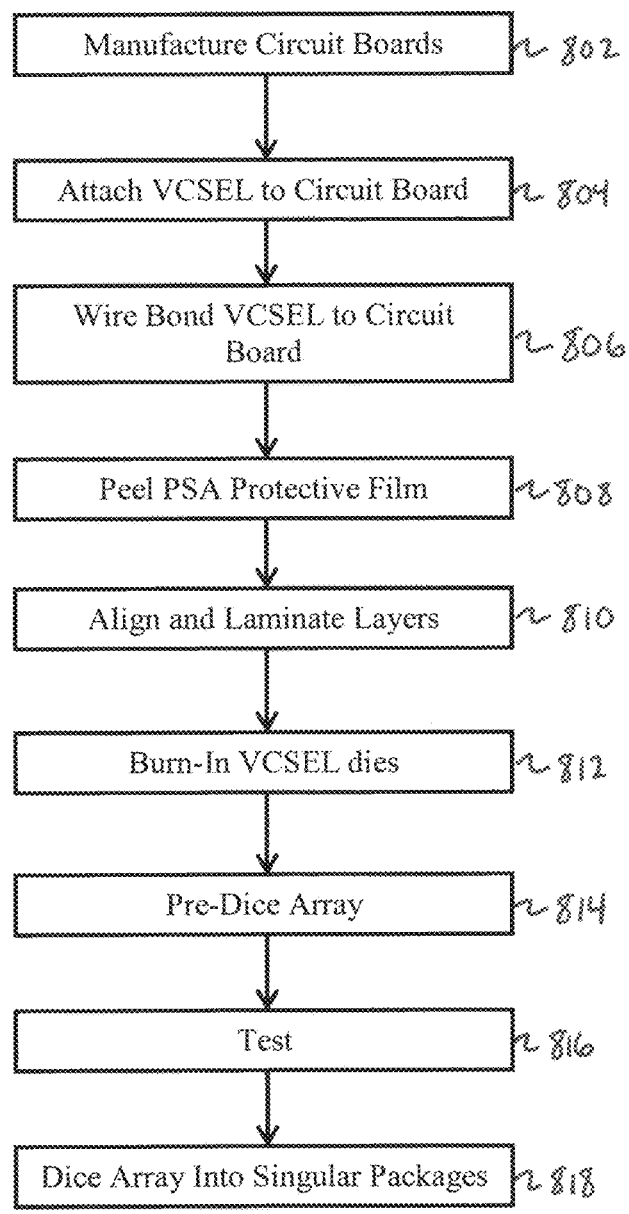
FIG. 8 is a flow chart of a method of making an optical package according to an embodiment of the present disclosure.
Figure 9A:
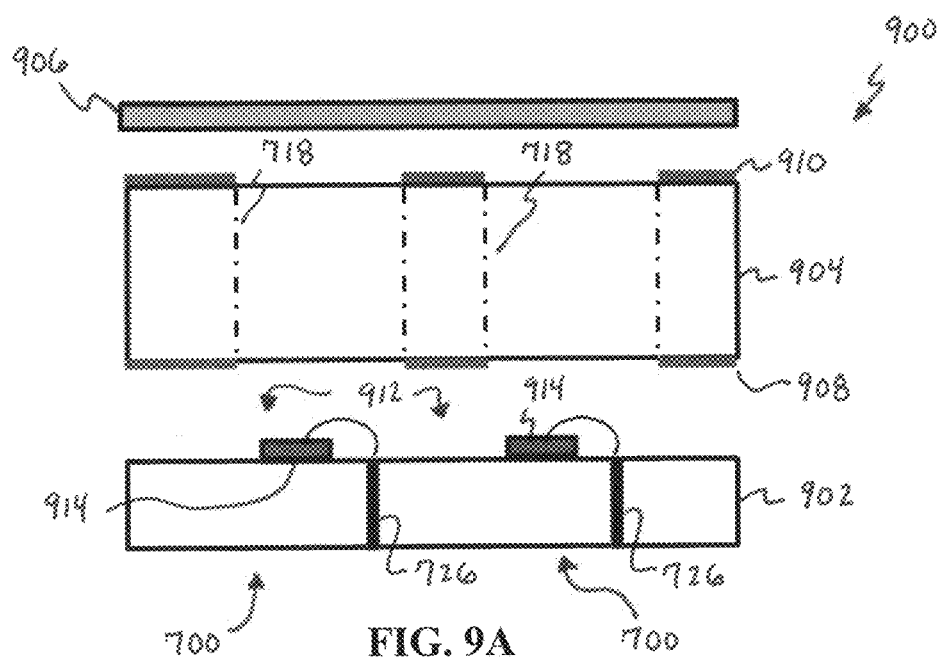
FIG. 9A is a schematic exploded view of an array panel of optical packages according to an embodiment of the present disclosure.

The previous embodiments outline how VCSELs or other optoelectronic device could be attached to a panel circuit board, sawn into individual packages, and then incorporated together with passive optical elements by adding individual spacers and the passive optical elements. FIGS. 7A-10 illustrate an implementation of another particular package embodiment 700 according to the present disclosure, where generally a second circuit board layer may be used as the spacer and the separate layers may be fabricated as an array of packages with, for example, lamination. As illustrated in FIG. 7A-7C, in this example embodiment, again the circuit board 702, illustrated in each of FIGS. 7A-7C, may be patterned with solder pads 704 configured or patterned to incorporate a VCSEL 706 on one side 708 (e.g., a top side) and the attachment of wire leads 116 (see FIG. 1A) (e.g., at positions 710, 712) on the other side 714 (e.g., a bottom side). However, other configurations, including more components, such as but not limited to a resistor and a capacitor, in different configurations, are possible and suitable. Any resistor, capacitor, or other component values may vary depending on the VCSEL used and application desired. The circuit board 702, which may be a PCB, a ceramic submount, or the like, may be any suitable size and shape. In one embodiment, however, the circuit board 702 as well as the overall package may generally have a hexagonal shape or cross-section, as illustrated in FIGS. 7A-7C. Such hexagonal shape may reduce the package area/footprint as well as the maximum diagonal dimension of the package. The circuit board 702, in one embodiment, may be a ceramic-filled epoxy board, such as the material identified as RO4350B provided by Rogers Corporation, and may include a wire bondable gold finish. As illustrated in FIG. 9A, the circuit board 702 may include vias 726, such as copper-filled vias, created through the circuit board to connect the VCSEL 706 to the circuit board core and wire leads. The vias 726 may be any suitable diameter, as previously indicated.

The VCSEL 706 may be mounted or attached to side 708 of the board 702 using any suitable means of attachment, such as a conductive epoxy or a solder. In one embodiment, the VCSEL 706 may be mounted or attached to a solder pad 704 on side 708 using a conductive silver epoxy and may be wire bonded to the opposite solder pad on side 708 to complete the circuit. The wire leads, as well as any other surface mount devices, may be soldered to side 714 of the board 702.

Optical package 700 may also include a spacer 716 or spacer layer, illustrated in FIG. 7A, operably coupled or otherwise attached to the circuit board 702. While the spacer 716 may be made from any suitable material, in one embodiment, the spacer layer 716 may be formed from a second circuit board that is ultimately diced into a hexagonal or other desired shape along with the circuit board 702, as will be described in further detail below. The spacer layer 716 may include a circular bore hole 718 in the middle therethrough. As indicated above, the spacer layer 716 may be suitably coupled, attached, or affixed to circuit board 702 using any suitable means for attachment, such as but not limited to, using an epoxy or other adhesive. The spacer layer 716 may be any suitable thickness and the bore hole 718 may have any suitable diameter, as may be required or desired for the application.

Optical package 700 may further include an optical component 720. In one embodiment, the optical component 720 may be a diffuser, such as a thin film, plastic diffuser. In one embodiment, the optical component 720 may be formed from a sheet of diffuser material that is ultimately diced into a hexagonal or other desired shape along with the circuit board 702 and spacer layer 716, as will be described in further detail below. The diffuser material may be mounted, diffuser surface toward the VCSEL 706, to the spacer using any suitable means of attachment, such as but not limited to, using an epoxy or other adhesive. In some embodiments, x- and y-alignment of the diffuser relative the VCSEL 706 may not be required. However, it may be desirable to maintain at least a 0.5 mm spacing between the VCSEL 706 and the diffuser 720. In one particular embodiment, the diffuser material may be a 10 mil, polycarbonate diffuser available from Luminit LLC.

Epoxy or adhesive layers 722, 724 may be provided to affix the circuit board 702, spacer layer 716, and diffuser (or other optical component) 720 to one another, as will be described in further detail below. In some embodiments, the spacer layer 716 may be pre-deposited with an adhesive film on both the top and bottom surfaces.

Figure 9B:
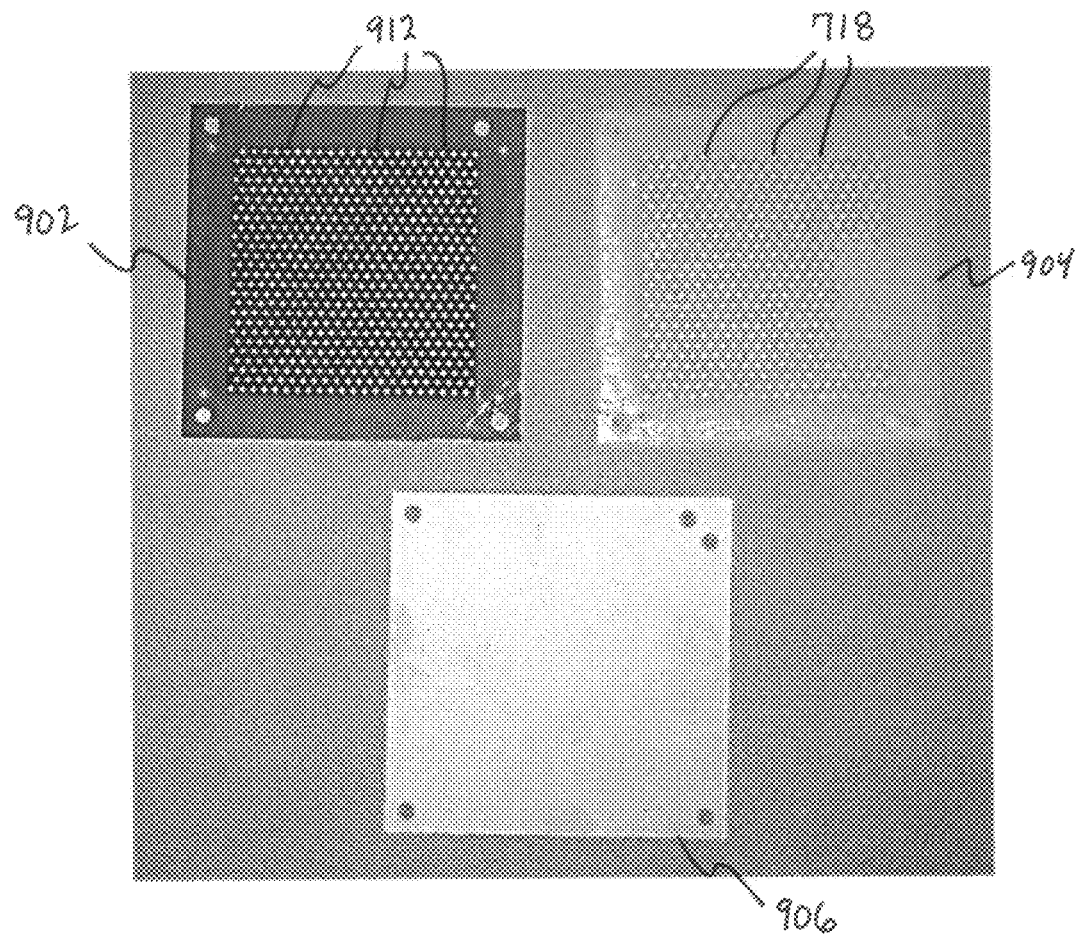
FIG. 9B illustrates 3 separate panel layers of an array of optical packages according to an embodiment of the present disclosure.

As described above, a panel of several circuit board-based packages 700 can be assembled simultaneously for additional efficiencies. One method 800, but not the only method, of manufacturing a panel or array of such packages 700 will now be described with reference to FIGS. 8-11C. As shown in FIG. 8, at step 802, two circuit board panels and the optical layer or panel may be first manufactured or otherwise obtained. As illustrated in FIGS. 9A and 9B, an array 900 of packages 700 may be manufactured from three separate panel layers 902, 904, and 906 operably affixed with one another via epoxy or adhesive layers 908, 910. At step 802, a wiring board panel 902 and a spacer circuit board panel 904 may first be manufactured or obtained. These circuit board panels may be manufactured by conventional circuit board manufacturers using standard techniques. The wiring board panel 902 and spacer circuit board panel 904 may be any suitable size and shape to hold a plurality of circuit boards 702 and corresponding spacers 716 adjacently positioned one another. In one embodiment, for example only, a 3" by 3" wiring board panel 902 may be utilized, and may support about 572 VCSEL submounts 912 in an array pattern. However, other sized wiring board panels 902 supporting other amounts of VCSEL submounts 912 are within the spirit and scope of the present disclosure. The spacer board panel 904 may be generally sized and dimensioned to match with the wiring board panel 902, and may contain a plurality of bore holes 718 each configured to align with a corresponding VCSEL submount 912 of the wiring board panel. In one embodiment, the spacer board panel 904 may be pre-deposited with an adhesive film, such as a pressure sensitive adhesive laminate, on both the top and bottom surfaces, forming the adhesive layers 908, 910. While discussed with respect to being another circuit board layer/panel, the spacer panel could alternatively be a sheet of some material other than a circuit board, such as a ceramic or plastic, for instance. An optical panel 906 may similarly be provided, generally sized and dimensioned to match with the wiring board panel 902 and spacer board panel 904. This panel 906 could be a diffuser sheet, an array of plastic molded lenses, diffraction gratings, or a sheet of any other suitable passive optical element(s).

With reference back to FIG. 8, at step 804, a VCSEL 914 may be mounted or attached to one or more, and in most cases each, VCSEL submount 912 of the wiring board panel 902. The VCSELs 914 may each be mounted or attached to a first solder pad of a corresponding submount 912, as previously described, using any suitable means of attachment, such as a conductive epoxy or a solder and, at step 806, may be wire bonded to the opposite solder pad of the same submount to complete the circuit.

At step 808, if the spacer board panel 904 has been pre-deposited with an adhesive laminate on one or both sides, then likely a protective plastic film covers the laminate. Prior to lamination of the separate panel layers 902, 904, and 906, this protective film or covering may be removed.

At step 810, the separate panel layers 902, 904, and 906 may be aligned such that the plurality of bore holes 718 of the spacer board layer 906 are each aligned with a corresponding VCSEL submount 912 and attached VCSEL 914 of the wiring board panel 902. The optical panel 906 may be aligned such that it covers each bore hole 718. When properly aligned, the panel layers 902, 904, and 906 may be laminated by, for example, placing them in a press, and then into an oven to cure the lamination by both heat and pressure, resulting in a laminated array of optical packages 700.

Figure 10A:
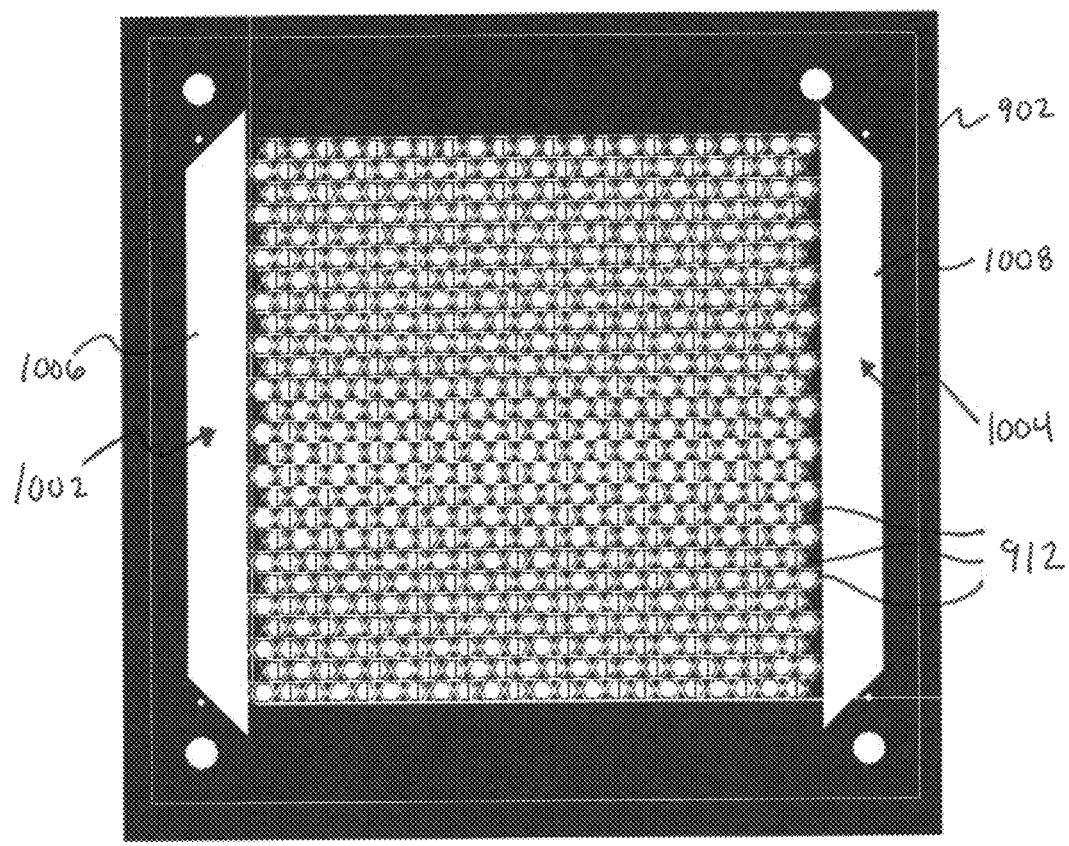
FIG. 10A is a schematic top view of a wiring board or circuit board panel for an array of optical packages according to an embodiment of the present disclosure.
Figure 10B:
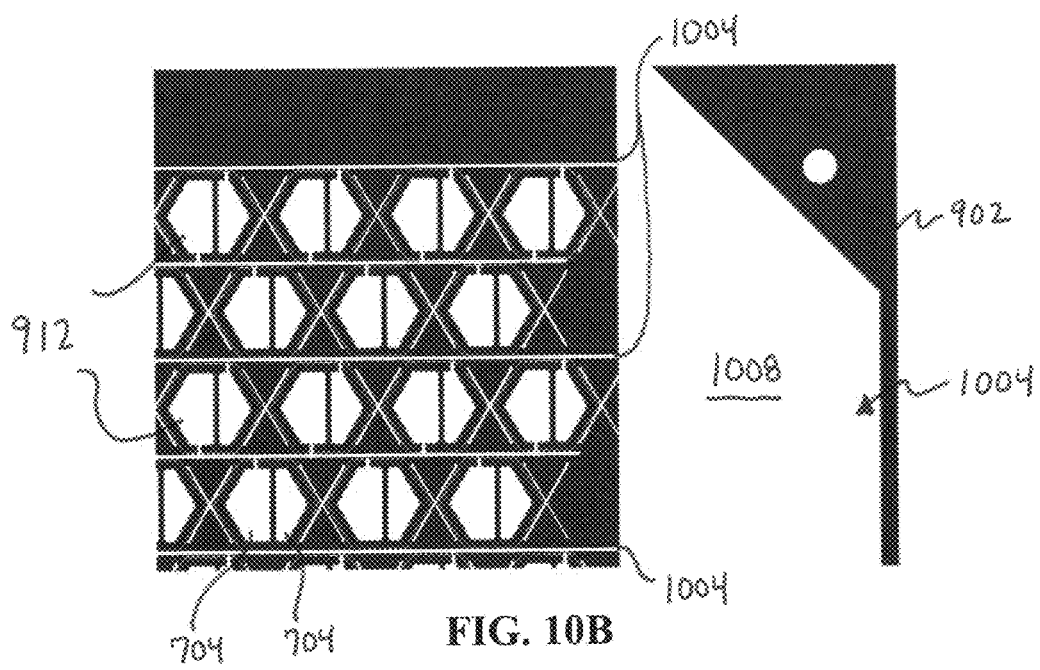
FIG. 10B is a close-up of a section of the wiring board or circuit board panel of FIG. 10A.

At step 812, the VCSELs may be burnt-in. In one embodiment, illustrated in FIGS. 10A and 10B, the wiring board panel 902 may be patterned with one or more bus bars 1002, 1004, such as a cathode bus bar 1002 and an anode bus bar 1004, which may be utilized to burn-in any attached VCSELS simultaneously prior to dicing the array into individual packages. Specifically, as illustrated in FIGS. 10A and 10B, for each VCSEL submount 912 site, there are two solder/bonding pads 704 illustrated. In the embodiment illustrated, the larger of the two pads 704 (referred to herein as the cathode pad) of each VCSEL submount site 912 may be electrically connected to the cathode of a corresponding VCSEL 914 mounted at the submount site. The smaller of the two pads 704 (referred to herein as the anode pad) may be electrically connected to the anode of the corresponding VCSEL 914 by a wire bond, as described above. In the embodiment illustrated, all of the cathode pads within two neighboring rows may be attached to each other and the cathode bus bar 1002, and all of the anodes within two neighboring rows may be attached to each other and the anode bus bar 1004. The bus bars 1002, 1004 may include corresponding bus pads 1006, 1008. By applying a forward bias to the VCSELs through the two large bus bar pads 1006, 1008 on either side of the panel, the VCSELs may be driven with a desired current to perform burn-in of the VCSELs. Burn-in could further be performed in an oven, thereby accelerating the VCSEL burn-in process even further.

In other embodiments, burn-in need not be performed at the array level. For example, the wiring board panel 902 could be suitably made without the bus bars 1002, 1004 for burn-in. In this case, the devices could be burned-in at another time, such as at the wafer level or after separation into individual packages.

With reference back to FIG. 8, at step 814, the laminated array 900 of optical packages 700 may be optionally pre-diced. That is, the array panel may be partially sawed through in various directions, to electrically disconnect the devices from one another. Likewise, at step 816, the package devices may be optionally, individually tested, for example with probe tips placed against the pads 704 of one or more of the arrayed packages. The pre-dicing step permits such testing. However, if pre-dicing is not performed, then the packages 700 can be tested individually after dicing.

Figure 11A:
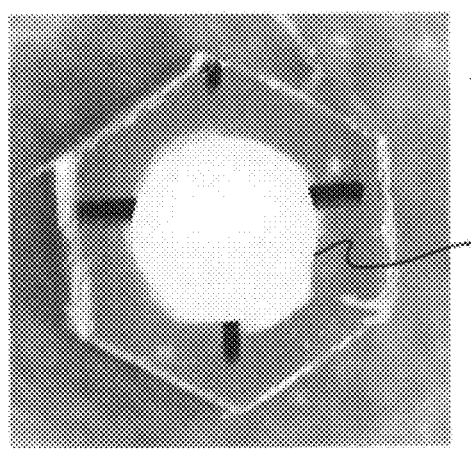
FIG. 11A is a top view of an optical package diced from an array of optical packages according to an embodiment of the present disclosure.
Figure 11B:
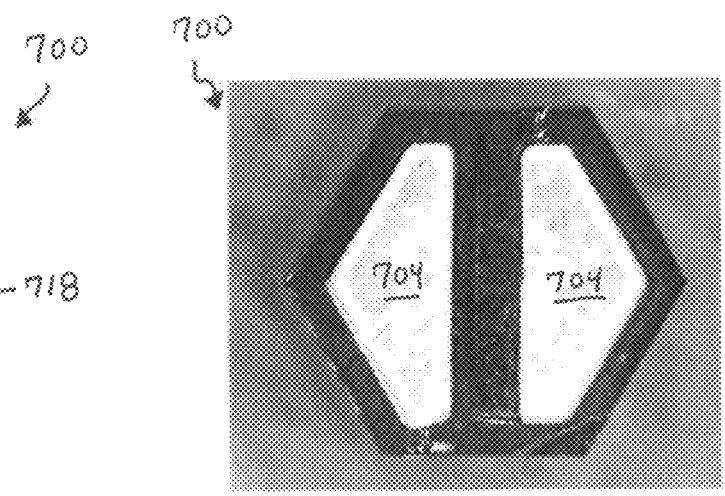
FIG. 11B is a bottom view of an optical package diced from an array of optical packages according to an embodiment of the present disclosure.
Figure 11C:
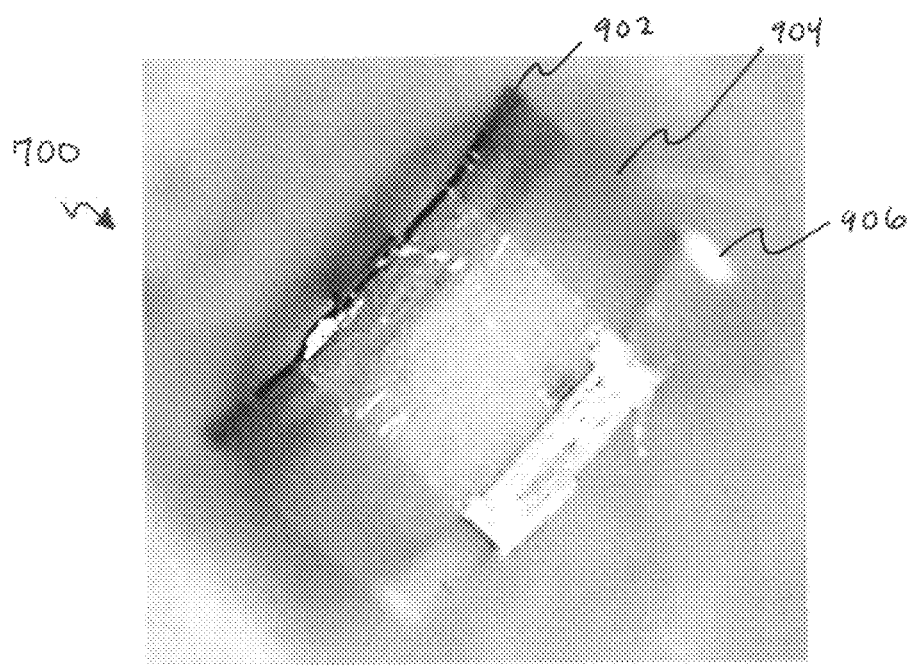
FIG. 11C is a side view of an optical package diced from an array of optical packages according to an embodiment of the present disclosure.

At step 818, the laminated array 900 may be diced into singular optical packages 700. The array pattern illustrated in FIGS. 9A-10B is for a hexagonal package 700, as described above. In this regard, in one embodiment, dicing or sawing may be performed in 3 directions (e.g., along the bus bars and guide lines visible in FIGS. 10A and 10B) to form a generally hexagonal shaped optical package. FIGS. 11A-11C illustrate an individually diced optical package 700. Specifically, FIG. 11A illustrates the top (or diffuser side) of the individually diced optical package 700. The bore hole 718 of the spacer layer 716 may be seen through the diffuser surface. FIG. 11B illustrates the bottom side of the individually diced optical package. The two bond pads 704 may be connected, such as through vias 726, to the cathode and anode pads for the VCSEL 706 (not visible). These are the pads one would probe in order to test the VCSELs, whether they are still in panel form or separated. FIG. 11C illustrates a side view of the individually diced optical package 700, wherein the 3 separate layers 902, 904, and 906 are visible.

Although the flowchart of FIG. 8 illustrates a method as a sequential process, many of the operations in the flowchart illustrated herein, or other methods discussed herein, can be performed in parallel or concurrently. In addition, the order of the method steps illustrated in the flowchart or described elsewhere herein may be rearranged for some embodiments. Similarly, the methods illustrated in the flow chart or described elsewhere herein could have additional steps not included therein or fewer steps than those shown.

While described mainly with respect to an optical package with a single VCSEL, it is recognized that the package could include more than one VCSEL or other optical device of the same type or more than one type of optical device. Likewise, the package of the present disclosure could include purely electrical integrated circuits that drive or condition the signals.

There are a variety of advantages provided by the optical packages of the present disclosure. For example, advantages of the optical packaging platform of the present disclosure may include, but are not limited to: 1) low cost: in some embodiments, many or all of the package components may be obtained or manufactured for very low cost, e.g., pennies apiece for small packages and plastic optics; 2) flexibility: the optical packaging platform of the present disclosure provides a great deal of flexibility, e.g., off-the-shelf passive optical components (lenses, diffusers, gratings, polarizers, holographic optical elements) may be purchased and combined with the active components (VCSELs, LEDs, and photodetectors) merely by fabricating the appropriate spacer; 3) fast prototyping and product development: circuit boards can be designed and built very quickly, avoiding the much more costly and time consuming requirements to custom design a package; 4) relatively simple assembly: a panel of board-based packages can be fabricated and then fully populated with optoelectronics (e.g., VCSELs), other ICs or passive electrical components, the spacers, and the optical elements, before singulating the individual boards. It was also observed that the attachment of a metal spacer provided additional thermal management to the optical packages of the present disclosure. It provided a greater thermal mass, allowing heat to be radiated away from the packaged more effectively. This was observed by monitoring the output power of the VCSEL at various steps of assembly. The VCSEL is sensitive to temperature, with output power dropping off as temperature rises. When the spacer was attached to the packaged, the VCSEL output power improved, indicating an improvement in heat removal from the packages.

As used herein, the terms "substantially" or "generally" refer to the complete or nearly complete extent or degree of an action, characteristic, property, state, structure, item, or result. For example, an object that is "substantially" or "generally" enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an ingredient or element may still actually contain such item as long as there is generally no measurable effect thereof.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

We claim:

1. A diffused array of vertical-cavity surface-emitting lasers (VCSELs) comprising:
    a substrate layer having a top side, a core, and a bottom side;
    an array of VCSELs fixed to the top side of the substrate layer;
    one or more vias extending from the bottom side to the top side and operating to connect the VCSEL to the substrate core;
    a metal spacer layer over the first layer, wherein the spacer layer comprises a plurality of holes therethrough, each of the plurality of holes aligning with a corresponding VCSEL of the VCSEL array and having vertical sidewalls; and
    a diffuser layer over the spacer layer, for diffusing light emitted by the array of VCSELs, wherein the diffuser layer is transparent over an entire extension thereof.

2. The diffused array of VCSELs of claim 1, wherein the substrate layer is a printed circuit board.

3. The diffused array of VCSELs of claim 2, wherein the spacer is affixed to the printed circuit board using an epoxy preform.

4. The diffused array of VCSELs of claim 2, wherein the spacer is affixed to the printed circuit board using an adhesive laminate.

5. The diffused array of VCSELs of claim 1, wherein the spacer layer is shaped and dimensioned to align with the first layer.

6. The diffused array of VCSELs of claim 5, wherein the diffuser layer is shaped and dimensioned to align with the spacer layer.

7. The diffused array of VCSELs of claim 1, wherein the diffuser layer is a sheet of light diffusing material.

8. The diffused array of VCSELs of claim 7, wherein the diffuser is a polycarbonate diffuser.

9. The diffused array of VCSELs of claim 7, wherein the diffuser is affixed to the spacer using one of an epoxy preform or an adhesive laminate.

10. The diffused array of VCSELs of claim 1, wherein the core is copper.

11. The diffused array of VCSELs of claim 1, wherein the vias are copper filled.

12. A diffused array of vertical-cavity surface-emitting lasers (VCSELs) comprising:
   a substrate layer having a top side, a core, and a bottom side;
   an array of VCSELs on the top side of the substrate layer;
   a resistor and a capacitor on the bottom side of the substrate layer;
   a diffuser, for diffusing light emitted by the array of VCSELs; and
   a spacer between the array of VCSELs and the diffuser, wherein the spacer comprises a circuit board having plurality of holes therethrough, each of the plurality of holes aligning with a VCSEL of the VCSEL array.

13. The diffused array of VCSELs of claim 12, wherein the diffuser is a sheet of light diffusing material.

14. The diffused array of VCSELs of claim 12, further comprising a first circuit board, wherein the VCSEL is coupled to the first circuit board.

15. The diffused array of VCSELS of claim 14, wherein the diffuser, the spacer, and the circuit board are shaped and dimensioned to align.

16. The diffused array of VCSELs of claim 14, wherein the spacer is affixed to the circuit board using one of an epoxy preform or an adhesive laminate.

17. The diffused array of VCSELs of claim 12, wherein the diffuser is affixed to the spacer using one of an epoxy preform or an adhesive laminate.

18. A diffused vertical-cavity surface-emitting laser (VCSEL) package comprising:
   a substrate layer having a top side, a copper core, and a bottom side;
   a VCSEL positioned over the top side of the substrate, wherein the VCSEL is in direct contact with the core of the substrate;
   a spacer layer over the substrate layer, the spacer layer having a bore hole therethrough, wherein the bore hole has vertical sidewalls and is aligned with the VCSEL; and
   a diffuser layer over the spacer layer, for diffusing light emitted by the VCSEL;
   wherein the package has a hexagonal shape.

19. The diffused VCSEL package of claim 18, further comprising vias, wherein the vias put the VCSELs are in direct with the core.

20. The diffused VCSEL package of claim 18, wherein the core is at least partially exposed and the VCSELs are placed directly on top of the core.

* * * * *